United States Patent
Yang et al.

(10) Patent No.: US 10,460,147 B2
(45) Date of Patent: Oct. 29, 2019

(54) DISPLAY SCREEN, DISPLAY DEVICE AND MOBILE TERMINAL

(71) Applicant: GUANGDONG OPPO MOBILE TELECOMMUNICATIONS CORP., LTD., Dongguan (CN)

(72) Inventors: Le Yang, Dongguan (CN); Haiping Zhang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 79 days.

(21) Appl. No.: 15/855,401

(22) Filed: Dec. 27, 2017

(65) Prior Publication Data

US 2018/0314873 A1 Nov. 1, 2018

(30) Foreign Application Priority Data

Apr. 27, 2017 (CN) .......................... 2017 1 0289430

(51) Int. Cl.
*G06K 9/00* (2006.01)
*G06F 3/041* (2006.01)
(Continued)

(52) U.S. Cl.
CPC .......... *G06K 9/0004* (2013.01); *G06F 3/042* (2013.01); *G06F 3/0412* (2013.01);
(Continued)

(58) Field of Classification Search
CPC .............. G06K 9/0004; G06K 9/0002; G06K 9/00026; G06K 9/00053; G06K 9/0012;
(Continued)

(56) References Cited

U.S. PATENT DOCUMENTS 10,229,359 B2 * 3/2019 Finlay ............... G06F 16/24542
10,296,777 B2 * 5/2019 Du ....................... H01L 27/3262
(Continued)

FOREIGN PATENT DOCUMENTS

CN 103942537 A 7/2014
CN 106098735 A 11/2016
(Continued)

OTHER PUBLICATIONS

PCT/CN2018/071314 International Search Report and Written Opinion dated Apr. 8, 2018, 9 pages.
(Continued)

*Primary Examiner* — Jose L Couso
(74) *Attorney, Agent, or Firm* — Lathrop Gage LLP

(57) ABSTRACT

A display screen is provided, including a display layer and a first light shielding layer. The display layer has a display surface, the first light shielding layer is arranged on the display surface and has a fingerprint recognition area, the fingerprint recognition area includes at least one first through hole sensing signals emitted and received by a fingerprint unit located below the display screen can be transmitted through the first through hole. A display device is provided, including the display screen and an optical fingerprint unit. The optical fingerprint unit is disposed at a side of the display layer away from the first light shielding layer and located at a position corresponding to an optical fingerprint recognition area. The fingerprint unit includes a light emitter and a light inductor, and a light signal emitted by the light emitter is transmitted to a fingerprint and received by the light inductor after being reflected by the fingerprint. A mobile terminal is provided.

19 Claims, 4 Drawing Sheets

(51) Int. Cl.
*G06F 3/042* (2006.01)
*G02F 1/1335* (2006.01)
*H01L 27/32* (2006.01)

(52) U.S. Cl.
CPC ...... *G06K 9/0002* (2013.01); *G02F 1/133512* (2013.01); *H01L 27/3272* (2013.01)

(58) Field of Classification Search
CPC ........... G06K 9/00899; G06K 9/00906; G06K 9/00919; G06K 9/228; G06F 3/0412; G06F 3/042; G06F 3/041; G06F 3/0421; G06F 3/0416; G06F 1/1626; G06F 1/1684; G06F 1/1696; G06F 21/32; G06F 21/83; G02F 1/133512; G02F 2001/13312; H01L 27/3272; G02B 27/30; G02B 27/58; G02B 5/201; G02B 5/208; G02B 6/04; H04M 1/0266
See application file for complete search history.

(56) References Cited

U.S. PATENT DOCUMENTS

| | | | |
|---|---|---|---|
| 2008/0122803 A1 | 5/2008 | Izadi et al. | |
| 2010/0067757 A1 | 3/2010 | Arai et al. | |
| 2011/0267298 A1 | 11/2011 | Erhart et al. | |
| 2015/0036065 A1 | 2/2015 | Yousefpor et al. | |
| 2016/0224816 A1 | 8/2016 | Smith et al. | |
| 2017/0192598 A1* | 7/2017 | Seen | G02B 6/0031 |
| 2018/0068166 A1* | 3/2018 | Zeng | G02F 1/1333 |
| 2018/0076268 A1* | 3/2018 | Wang | G06K 9/0004 |
| 2018/0137337 A1* | 5/2018 | Zeng | G06K 9/00013 |
| 2018/0239455 A1* | 8/2018 | Jia | G06K 9/0004 |
| 2018/0276444 A1* | 9/2018 | Sun | G02F 1/133512 |
| 2018/0315803 A1* | 11/2018 | Jin | G02F 1/13338 |
| 2019/0012510 A1* | 1/2019 | Xu | G06K 9/0004 |
| 2019/0026523 A1* | 1/2019 | Shen | G06K 9/0004 |
| 2019/0050621 A1* | 2/2019 | Xu | G06K 9/0004 |
| 2019/0056613 A1* | 2/2019 | Wang | G02F 1/13338 |
| 2019/0065813 A1* | 2/2019 | Xu | G06K 9/0004 |
| 2019/0213379 A1* | 7/2019 | Zhao | G06K 9/0004 |

FOREIGN PATENT DOCUMENTS

| | | |
|---|---|---|
| CN | 106292844 A | 1/2017 |
| CN | 106298859 A | 1/2017 |
| CN | 107102693 A | 8/2017 |
| TW | I263854 B | 10/2006 |
| TW | 200901043 A | 1/2009 |
| TW | I525552 B | 3/2016 |
| WO | WO 016952 A2 | 9/2001 |

OTHER PUBLICATIONS

European Patent Application No. 17210894.6, Extended Search and Opinion dated Jun. 13, 2018, 9 pages.
Taiwan Patent Application No. 106143847 Office Action dated Dec. 19, 2018, 6 pages.
European Patent Application No. 17210894.6, Office Action dated Feb. 18, 2019, 7 pages.

* cited by examiner

DISPLAY SCREEN, DISPLAY DEVICE AND MOBILE TERMINAL

CROSS-REFERENCE TO RELATED APPLICATIONS

The application claims priority to and benefits of Chinese Patent Application Serial No. 201710289430.3, filed with the State Intellectual Property Office of P. R. china on Apr. 27, 2017, the entire content of which is incorporated herein by reference.

FIELD

The present disclosure relates to a field of electronic apparatus, and particularly to a display screen, a display device and a mobile terminal.

BACKGROUND

In the related art, fingerprint recognition unit is disposed outside a display area of a display panel so as to be prevented from hindering display. However, with such a structure design, a display area-to-screen ratio (a ratio of the display area to the whole display screen) is low. The display area-to-screen ratio can be increased by disposing a fingerprint unit and the display screen in a superposition manner. With such a kind of structure, however, the display screen blocks a sensing signal of the fingerprint unit, which causes low fingerprint acquisition efficiency of the fingerprint unit.

SUMMARY

The present disclosure provides a display screen. The display screen includes a display layer and a first light shielding layer. The display layer has a display surface towards a user, the first light shielding layer is arranged on the display surface, the first light shielding layer has a fingerprint recognition area, the fingerprint recognition area includes at least one first through hole, and the first through hole is configured so that sensing signals emitted and received by a fingerprint unit located below the display screen can be transmitted through the first through hole.

The present disclosure provides a display device, including the above-mentioned display screen, and further including an optical fingerprint unit and a middle frame. The display screen and the optical fingerprint unit are fastened to the middle frame, and the optical fingerprint unit is disposed at a side of the display layer away from the first light shielding layer and located at a position corresponding to an optical fingerprint recognition area. The optical fingerprint unit includes a light emitter and a light inductor, and fingerprint recognition is performed by a first light signal emitted by the light emitter and a second light signal received by the light inductor passing through the first through hole.

The present disclosure provides a mobile terminal, including the above-mentioned display device.

BRIEF DESCRIPTION OF THE DRAWINGS

To describe the technical solutions in the embodiments of the present disclosure more clearly, the accompanying drawings required for describing the embodiments are briefly introduced in the following. Apparently, the accompanying drawings in the following description illustrate merely some embodiments of the present disclosure, and those ordinarily skilled in the art can also derive other drawings from these accompanying drawings without creative efforts.

DETAILED DESCRIPTION

The technical solutions of the embodiments of the present disclosure are clearly and completely described below with reference to the accompanying drawings in the embodiments of the present disclosure.

Figure 1:
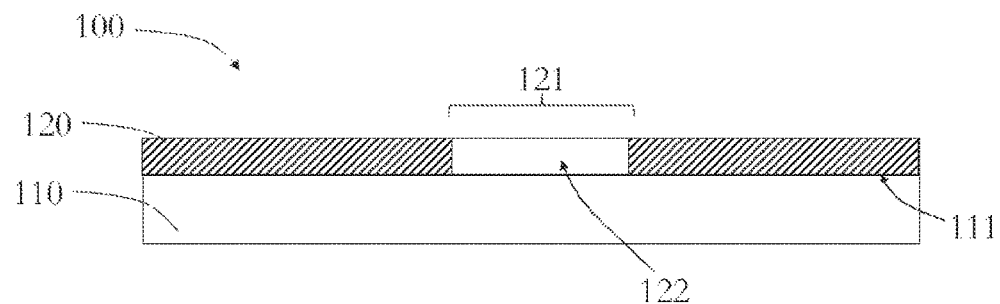
FIG. 1 is a schematic view of a display screen provided in an embodiment of the present disclosure.

Referring to FIG. 1, FIG. 1 illustrates a display screen 100 provided in embodiments of the present disclosure. The display screen 100 includes a display layer 110 and a first light shielding layer 120. The display layer 110 is a portion of the display screen 100 and is configured to display images. The display layer 110 is provided with a display surface 111 towards a user, and the first light shielding layer 120 is arranged on the display surface 111. The first light shielding layer 120 has a fingerprint recognition area 121, the fingerprint recognition area 121 includes at least one first through hole 122, and sensing signals emitted and received by a fingerprint unit located below the display screen pass through the first through hole 122.

In the present embodiment, the display screen 100 can be an organic light-emitting diode (OLED), a liquid crystal display (LCD) and the like. The first light shielding layer 120 can be a light-filtering layer, a polarizing layer, a color microelectronic printed layer, a flat layer and etc. The fingerprint unit can be an optical fingerprint unit, a capacitive fingerprint unit, a radio frequency fingerprint unit, an ultrasonic fingerprint unit and etc. The sensing signal can be an optical signal, an electrical signal, an ultrasonic signal and etc.

Figure 2:
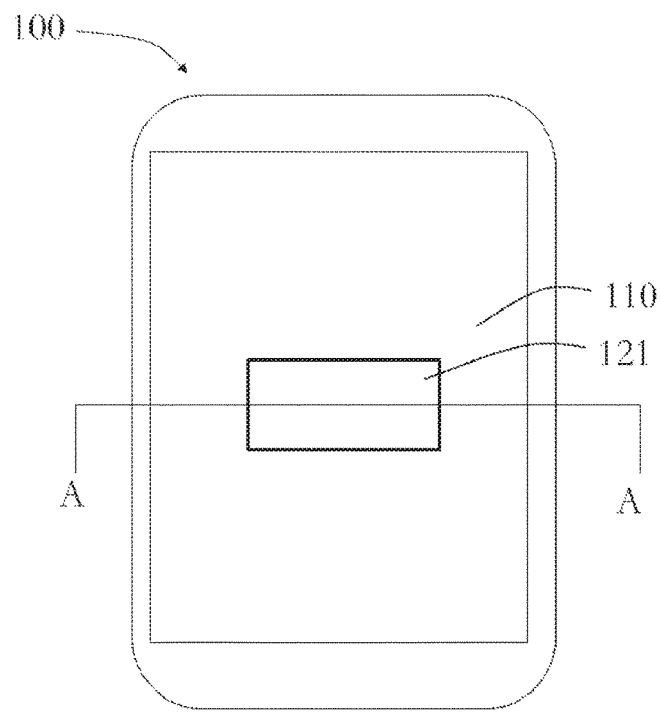
FIG. 2 is a top view of a display screen provided in an embodiment of the present disclosure.
Figure 3:
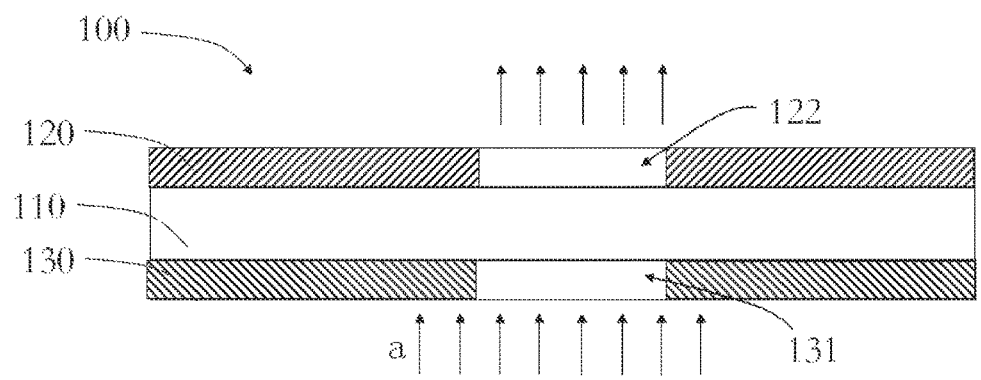
FIG. 3 is a sectional view of FIG. 2 taken along the line AA'.

Referring to FIGS. 2 and 3, the display screen 100 further includes a second light shielding layer 130, and the second light shielding layer 130 is disposed to a side of the display layer 110 away from the first light shielding layer 120 so as to prevent structures (such as electronic circuits) below the display screen 100 from being seen. The second light shielding layer 130 can be a light-shielding foam layer, a lightproof ink layer, or a reflective layer configured to reflect light. The second light shielding layer 130 can hide structures (such as the electronic circuits) below the display screen 100 from view, so that the display layer 110 is allowed to present a color of the second light shielding layer 130 when the display screen 100 is in a nonluminous state. The second light shielding layer 130 can be black, white, or in other colors.

Referring to FIG. 3, in an embodiment, the fingerprint unit is the optical fingerprint unit, and the optical fingerprint unit is disposed at a side of the display screen 100 away from the user. The second light shielding layer 130 is provided with a second through hole 131, and the second through hole 131 is configured so that the light signals emitted and received by the optical fingerprint unit can be transmitted through the second through hole 131.

Further, the first through hole 122 and the second through hole 131 are disposed to be right opposite to each other, and the first through hole 122 and the second through hole 131 have a same size. In the present embodiment, the first through hole 122 and the second through hole 131 are allowed to form a light-transparent passage along a thickness direction of the display screen 100, and the passage is disposed between the optical fingerprint unit and the fingerprint recognition area 121 so as to facilitate transmission of the light signals emitted and received by the optical fingerprint unit, reduce obstruction of the display screen 100 to the signals, hence improve fingerprint recognition and acquisition efficiency.

Figure 4:
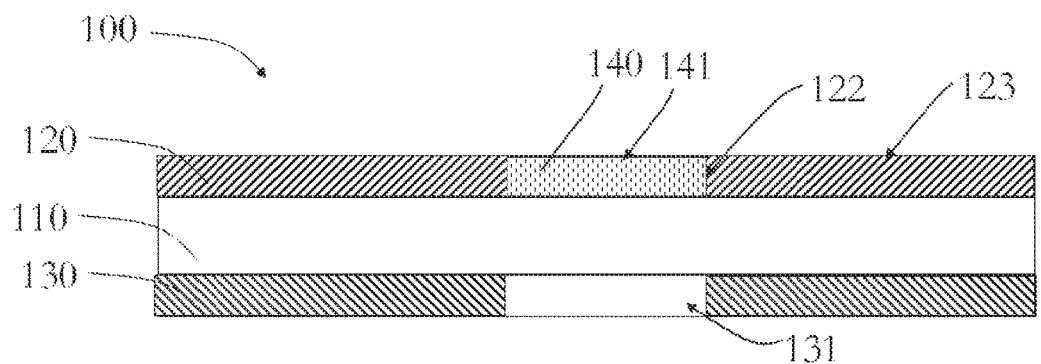
FIG. 4 is a schematic view of a display screen provided in an embodiment of the present disclosure.

In an embodiment, referring to FIG. 4, the first through hole 122 is filled with a light-transparent layer 140. The light-transparent layer 140 is provided with a first surface 141 away from the display layer 110, the first light shielding layer 120 is provided with a second surface 123 away from the display layer 110, and the first surface 141 is flush with the second surface 123. In the present embodiment, by filling the light-transparent layer 140 in the first through hole 122 and making respective surfaces, towards the user, of the light-transparent layer 140 and the first light shielding layer 120 flush, not only the light-transparent layer 140 does not influence light transmittance of the first through hole 122, but also it is possible to avoid causing a uneven surface of the first light shielding layer 120 when the first light shielding layer 120 is provided with the first through hole 122 and hence avoid influencing flatness when other functional layers are superposed on the first light shielding layer 120 subsequently. Preferably, a shape and size of the light-transparent layer 140 can be same with those of the first through hole 122, which enables gapless filling between the light-transparent layer 140 and the first through hole 122, thus making the surface of the first light shielding layer 120 highly flat.

Figure 5:
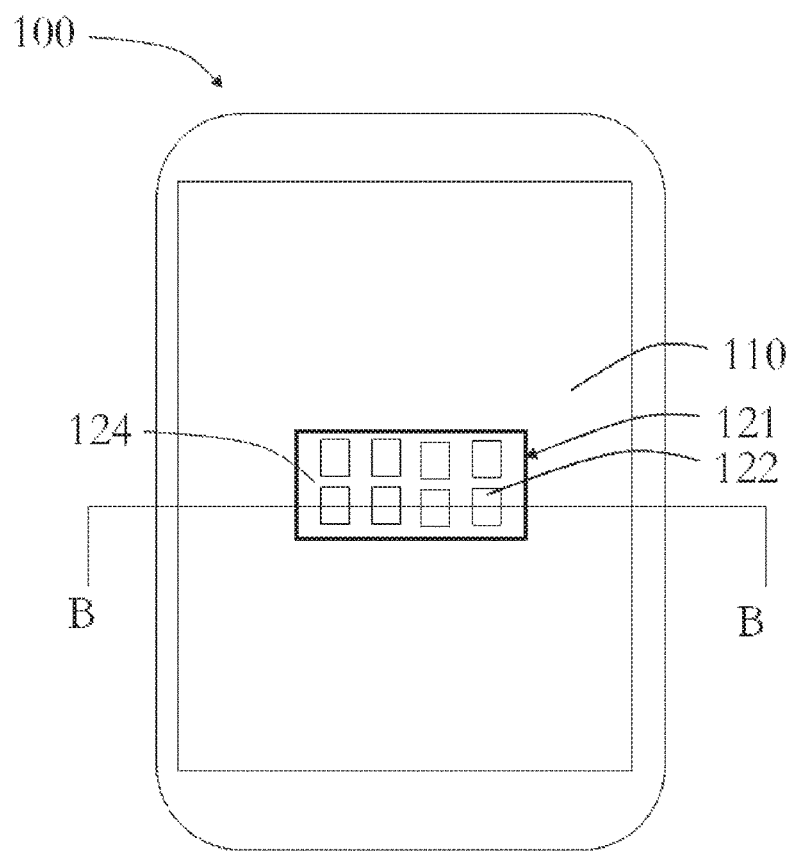
FIG. 5 is a top view of a display screen provided in an embodiment of the present disclosure.

In an embodiment, referring to FIG. 5, the fingerprint recognition area 121 is provided with a plurality of first through holes 122 and light shielding portions 124 among the plurality of first through holes 122.

Figure 6:
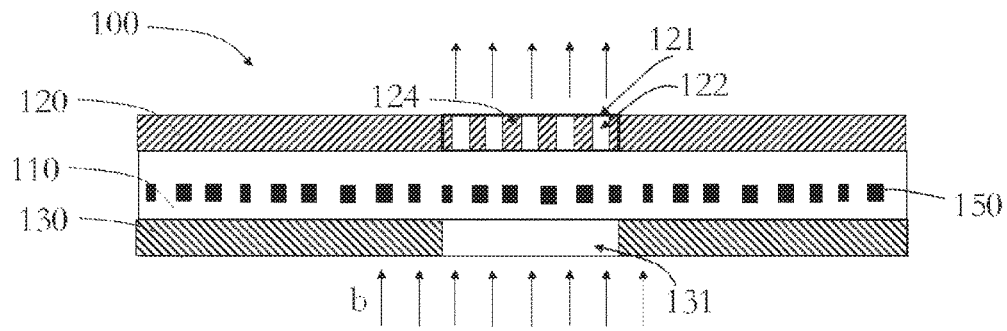
FIG. 6 is a sectional view of FIG. 5 taken along the line BB'.

Referring to FIG. 6, the display layer 110 includes a light-reflecting layer 150, the light-reflecting layer 150 can produce reflected light illuminated by an outside light source, and in this way, the user's eyes can not only receive the light emitted by the display layer 110, but also receive the reflected light produced by the light-reflecting layer 150. Particularly, the light-reflecting layer 150 produces stronger reflected light when illuminated by a strong light source outside, the stronger reflected light interrupts the display image of the display layer 110, influencing the user experience. The light-reflecting layer 150 can be a reflecting sheet displaying the light source or a metal signal line in the display layer 110.

Referring to FIG. 6, an orthographic projection area of the fingerprint recognition area 121 on the second light shielding layer 130 coincides with an area of the second through hole 131. An orthographic projection area of the light shielding portions 124 on the display layer 110 coincides with a part of an area of the light-reflecting layer 150. In the present embodiment, by making the light shielding portions 124 in the fingerprint recognition area 121 cover the area of the light-reflecting layer 150, the reflected light produced the area of the light-reflecting layer 150 is blocked, and influence on the user's visual sense by the light-reflecting layer 150 reflecting the outside light source is reduced.

In the present embodiment, the first light shielding layer 120 is the polarizing layer and configured to prevent a reflected light signal of the light-reflecting layer 150 from being transmitted. In other embodiments, the first light shielding layer 120 can also be other light-shielding components, such as the microelectronics printed layer or the flat layer. It could be understood that the first light shielding layer 120 can also be disposed in other positions at a side, towards the user, of the light-reflecting layer 150. For example, the first light shielding layer 120 can also be disposed in the display layer 110.

Figure 7:
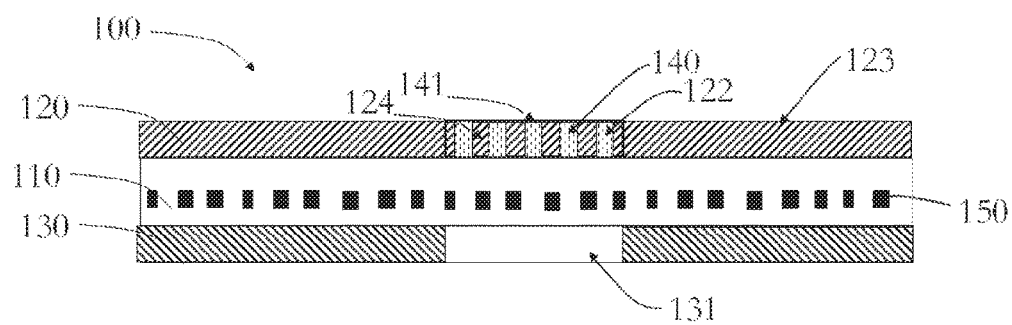
FIG. 7 is a schematic view of a display screen provided in an embodiment of the present disclosure.

Referring to FIG. 7, the plurality of the first through holes 122 can be filled with a light-transparent layer 140', the light-transparent layer 140' is provided with a first surface 141' away from the display layer 110, the first light shielding layer 120 is provided with a second surface 123 away from the display layer 110, and the first surface 141' is flush with the second surface 123. In the present embodiment, by filling the light-transparent layer 140' in the first through hole 122 and making respective surfaces, towards the user, of the light-transparent layer 140' and the first light shielding layer 120 flush, not only the light-transparent layer 140' does not influence the light transmittance of the first through hole 122, but also it is possible to avoid causing the uneven surface of the first light shielding layer 120 when the first light shielding layer 120 is provided with the first through hole 122 and hence avoid influencing the flatness when other functional layers are superposed on the first light shielding layer 120 subsequently. Preferably, a shape and size of the light-transparent layer 140' can be same with those of the first through hole 122, which enables gapless filling between the light-transparent layer 140' and the first through hole 122, thus making the surface of the first light shielding layer 120 highly flat.

Figure 8:
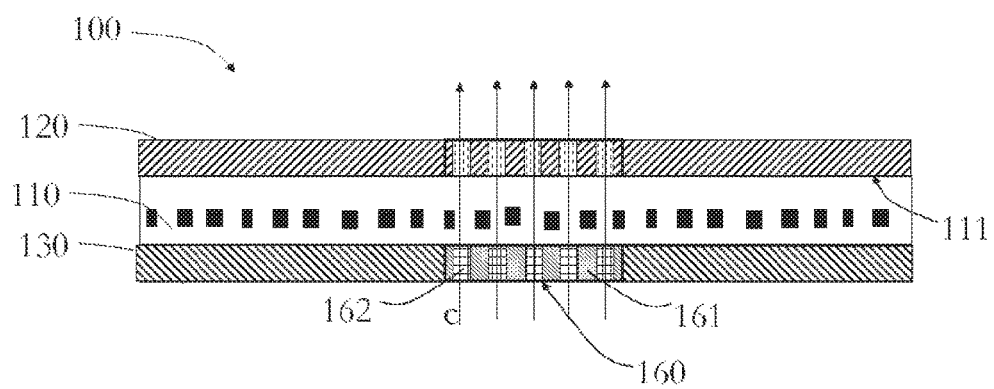
FIG. 8 is a schematic view of a display screen provided in an embodiment of the present disclosure.

Referring to FIG. 8, the second through hole 131 is provided with a light-shielding sheet 160. The light-shielding sheet 160 is provided with a light-transparent passage 162. Specifically, the light-shielding sheet 160 includes a light-shielding pigment 161 and a light-transparent material, a plurality of light-transparent passages 162 is formed of the light-transparent material, the light-transparent passage 162 is along the thickness direction of the display screen 100, and a light signal c emitted and received by the optical fingerprint unit is transmitted through the plurality of light-transparent passages 162. The light-shielding sheet 160 covers the second through hole 131, allows transmitting of the light signal c so that the light signal c emitted and received by the fingerprint unit disposed below the second through hole 131 can be transmitted, and can reflect the light so as to hide the fingerprint unit. Preferably, reflected light of the light-shielding sheet 160 has the same color with reflected light of the second light shielding layer 130, so as to make the area of the second through hole 131 have the same display color as other areas of the second light shielding layer 130 when the display layer 110 is in a non-display state such as in a screen-off state of the mobile terminal, thereby reducing the visual influence of the second through hole 131 on the user and enhancing the user experience. In the present embodiment, the light-shielding pigment 161 has the same color as the second light shielding layer 130, and it could be understood that, the color of the light-shielding pigment 161 sensed by naked eyes of the user is the same as that of the second light shielding layer 130. The color of the second light shielding layer 130 can be black, white, or other colors, and correspondingly, the color of the light-shielding pigment 161 can also be black, white, or other colors.

The light-transparent material can be a transparent material such as resin particles, glass powders, or a mixture of resin particles and glass powders. These transparent materials have a certain light transmission property and allow light to pass through. When the light-shielding sheet 160 is added with the light-transparent material, the light transmission property of the light-shielding sheet 160 can be increased. The light-transparent material is in a granular shape. If a granule of the light-transparent material is too small, the light transmission cannot be achieved. If the granule of the light-transparent material is too large, the light-shielding sheet 160 and the second light shielding layer 130 may have a color difference. Therefore, optionally, a size of the granule of the light-transparent material is 1~20 μm. Further, if a ratio of the light-transparent material to the light-shielding sheet 160 is too low, the light transmission property of the light-shielding sheet 160 cannot be increased effectively. If the ratio of the light-transparent material to the light-shielding sheet 160 is too high, the color of the light-shielding sheet 160 will be influenced. Therefore, a mass percent of the light-transparent material to the light-shielding sheet 160 is 1%~20%.

Further, an orthographic projection area of the plurality of first through holes 122 on the second light shielding layer 130 can coincide with the area of the plurality of light-transparent passages 162.

The fingerprint recognition area 121 can be circular, square, oval or in an irregular shape. The irregular shape can be a shape adapted to a contact surface between the finger and the display screen 100.

The present disclosure doesn't limit the shape, size and number of the first through hole 122 and the second through hole 131.

The present application doesn't limit the size and number of the fingerprint recognition area 121, and the fingerprint recognition area 121 can be a local area of the display layer 110 or the whole area of the display layer 110. When the fingerprint recognition area 121 is the local area of the display layer 110, one fingerprint recognition area 121 or a plurality of fingerprint recognition areas 121 can be provided.

Figure 9:
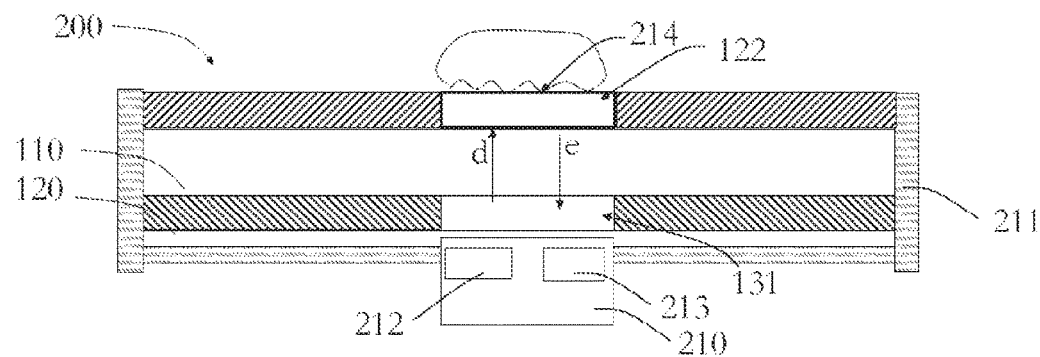
FIG. 9 is a schematic view of a display device provided in an embodiment of the present disclosure.

Referring to FIG. 9, the present application further provides a display device 200, which includes the display screen 100 according to any one of the above-mentioned embodiments, and further includes an optical fingerprint unit 210 and a middle frame 211. The display screen 100 and the optical fingerprint unit 210 are fastened to the middle frame 211. The optical fingerprint unit 210 is disposed at a side of the display layer 110 away from the first light shielding layer 120 and located at a position corresponding to an optical fingerprint recognition area 121. The optical fingerprint unit 210 includes a light emitter 212 and a light inductor 213, and the fingerprint recognition is performed by a first light signal emitted by the light emitter 212 and a second light signal received by the light inductor 213 both passing through the first through hole 122. In other embodiment, the fingerprint unit can also be the capacitive fingerprint unit, or the radio frequency fingerprint unit, or the ultrasonic fingerprint unit.

When the finger is pressed on the display screen 100, light emitted by the light emitter 212 forms incident light d. The incident light d is cast on a fingerprint 214 through the light inductor 213, the second through hole 131 and the first through hole 122. Reflected light e is formed by the reflection of the fingerprint 214, the reflected light e is received by the light inductor 213, and a fingerprint image of the fingerprint 214 is obtained after the reflected light e is processed.

Figure 10:
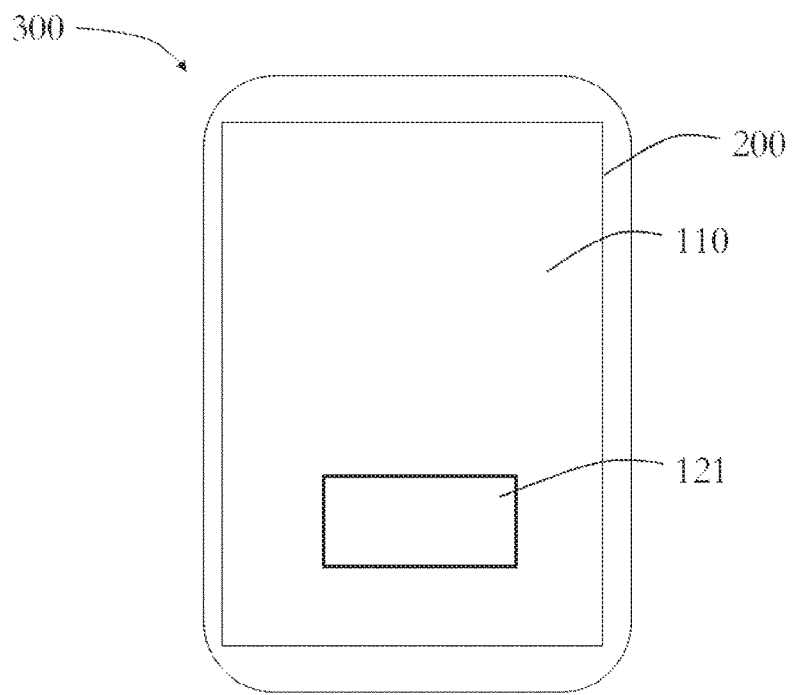
FIG. 10 is a schematic view of a mobile terminal provided in an embodiment of the present disclosure.

Referring to FIG. 10, embodiments of the present disclosure provide a mobile terminal 300, including the display device 200 in any one of the above-mentioned embodiments. The mobile terminal provided in embodiments of the present disclosure can be a portable electronic device or a communication device, such as a smart phone, a personal digital assistant (PDA), a tablet computer, a notebook computer, a POS machine, or even an onboard computer, which is not limited thereto.

In the mobile terminal provided in embodiments of the present disclosure, the fingerprint recognition area 121 of the first light shielding layer 120 is provided with at least one first through hole 122, and the fingerprint unit is located at the position corresponding to the fingerprint recognition area 121. The at least one first through hole 122 increases transmittance of the sensing signals received or emitted by the fingerprint unit 210, thereby improving the fingerprint acquisition efficiency and enhancing the user experience.

To sum up, although the disclosure has been disclosed by the preferred embodiments, the preferred embodiments are not intended to limit the disclosure. Those ordinarily skilled in the art can make various changes and modifications without departing from the spirit and scope of the present disclosure, therefore the protection scope of the present disclosure is defined by the scope of the claims.

The above are the referred embodiments of the present disclosure. It should be noted that those skilled in the art can make some improvements and retouches without departing from the principle of the present disclosure, which are also deemed as the protection scope of the present disclosure.

What is claimed is:

1. A display screen, comprising a display layer and a first light shielding layer, the display layer having a display surface towards a user, the first light shielding layer being arranged on the display surface, the first light shielding layer having a fingerprint recognition area, the fingerprint recognition area comprising a plurality of first through holes and a plurality of light shielding portions among the plurality of first through holes, the plurality of the first through holes being configured so that sensing signals emitted and received by a fingerprint unit located below the display screen can be transmitted through the plurality of the first through holes;

wherein the display layer comprises a light-reflecting layer, and the first light shielding layer is a polarizing layer configured to block a reflected light signal of the light-reflecting layer from being emitted; and within an orthographic projection area of the fingerprint recognition area in the display layer, an orthographic projection of the plurality of the light shielding portions in the display layer completely covers an orthographic projection of the light-reflecting layer in the display layer.

2. The display screen according to claim 1, wherein the first light shielding layer is selected from a group consisting of a light-filtering layer, a polarizing layer, a color microelectronic printed layer, and a flat layer.

3. The display screen according to claim 1, wherein the fingerprint unit is selected from a group consisting of an optical fingerprint unit, a capacitive fingerprint unit, a radio frequency fingerprint unit, and an ultrasonic fingerprint unit.

4. The display screen according to claim 1, wherein a shape of the fingerprint recognition area is selected from a group consisting of a circular shape, a square shape, an oval shape and an irregular shape, the irregular shape being matched with a contact surface between a finger and the display screen.

5. The display screen according to claim 1, further comprising a second light shielding layer, wherein the second light shielding layer is disposed at a side of the display layer away from the first light shielding layer, the second light shielding layer is provided with a second through hole, and the second through hole and the plurality of the first through holes are configured so that the sensing signals emitted and received by the fingerprint unit can be transmitted through the second through hole and the plurality of the first through holes.

6. The display screen according to claim 5, wherein the second light shielding layer is selected from a group consisting of a light-shielding foam layer, a lightproof ink layer, and a reflective layer.

7. The display screen according to claim 5, wherein the plurality of the first through holes and the second through hole are disposed to be right opposite to each other, and the plurality of the first through holes has the same size as the second through hole.

8. The display screen according to claim 7, wherein the plurality of the first through holes is filled with a light-transparent layer, the light-transparent layer is provided with a first surface away from the display layer, the first light shielding layer is provided with a second surface away from the display layer, and the first surface is flush with the second surface.

9. The display screen according to claim 8, wherein a shape and size of the light-transparent layer are same with a shape and size of the plurality of the first through holes.

10. The display screen according to claim 5, wherein an orthographic projection area of the fingerprint recognition area on the second light shielding layer coincides with an area of the second through hole.

11. The display screen according to claim 10, wherein the second through hole is provided with a light-shielding sheet, the light-shielding sheet comprises a light-shielding pigment and a light-transparent material, a plurality of light-transparent passages is formed of the light-transparent material, the plurality of light-transparent passages is configured so that a light signal emitted and received by the optical fingerprint unit can be transmitted through the plurality of light-transparent passages, and the light-shielding pigment has the same color as the second light shielding layer.

12. The display screen according to claim 11, wherein the light-transparent material is selected from a group consisting of resin particles, glass powders, and a mixture of resin particles and glass powders.

13. The display screen according to claim 11, wherein a size of a granule of the light-transparent material is 1~20 µm.

14. The display screen according to claim 11, wherein a mass percent of the light-transparent material to the light-shielding sheet is 1%~20%.

15. The display screen according to claim 11, wherein an orthographic projection area of the plurality of the plurality of the first through holes on the second light shielding layer coincides with an area of the plurality of light-transparent passages.

16. A display device, comprising a display screen, an optical fingerprint unit and a middle frame, the display screen comprising a display layer and a first light shielding layer, the display layer having a display surface towards a user, the first light shielding layer being arranged on the display surface, the first light shielding layer having a fingerprint recognition area, the fingerprint recognition area comprising a plurality of the first through holes and a plurality of light shielding portions among the plurality of the first through holes, the plurality of the first through holes being configured so that sensing signals emitted and received by a fingerprint unit located below the display screen can be transmitted through the plurality of the first through holes, the display screen and the optical fingerprint unit being fastened to the middle frame, the optical fingerprint unit being disposed at a side of the display layer away from the first light shielding layer and located at a position corresponding to an optical fingerprint recognition area, the optical fingerprint unit comprising a light emitter and a light inductor, and fingerprint recognition being performed by a first light signal emitted by the light emitter and a second light signal received by the light inductor passing through the plurality of the first through holes;

wherein the display layer comprises a light-reflecting layer, and the first light shielding layer is a polarizing layer configured to block a reflected light signal of the light-reflecting layer from being emitted; and within an orthographic projection area of the fingerprint recognition area in the display layer, an orthographic projection of the plurality of the light shielding portions in the display layer completely covers an orthographic projection of the light-reflecting layer in the display layer.

17. The display device according to claim 16, wherein the fingerprint unit is selected from a group consisting of a capacitive fingerprint unit, a radio frequency fingerprint unit, and an ultrasonic fingerprint unit.

18. A mobile terminal, comprising a display device, the display device comprising a display screen, an optical fingerprint unit and a middle frame, the display screen comprising a display layer and a first light shielding layer, the display layer having a display surface towards a user, the first light shielding layer being arranged on the display surface, the first light shielding layer having a fingerprint recognition area, the fingerprint recognition area comprising a plurality of first through holes and a plurality of light shielding portions among the plurality of the first through holes, the plurality of the first through holes being configured so that sensing signals emitted and received by a fingerprint unit located below the display screen can be transmitted through the plurality of the first through holes, the display screen and the optical fingerprint unit being fastened to the middle frame, the optical fingerprint unit being disposed at a side of the display layer away from the first light shielding layer and located at a position corresponding to an optical fingerprint recognition area, the optical fingerprint unit comprising a light emitter and a light inductor, and fingerprint recognition being performed by a first light signal emitted by the light emitter and a second light signal received by the light inductor passing through the plurality of the first through holes;

wherein the display layer comprises a light-reflecting layer, and the first light shielding layer is a polarizing layer configured to block a reflected light signal of the light-reflecting layer from being emitted; and within an orthographic projection area of the fingerprint recognition area in the display layer, an orthographic projection of the plurality of the light shielding portions in the display layer completely covers an orthographic projection of the light-reflecting layer in the display layer.

19. The mobile terminal according to claim 18, wherein the mobile terminal is selected from a group consisting of a smart phone, a personal digital assistant, a tablet computer, a notebook computer, a POS machine, and an onboard computer.

\* \* \* \* \*